US007948071B2

(12) United States Patent
Thomas et al.

(10) Patent No.: US 7,948,071 B2
(45) Date of Patent: May 24, 2011

(54) INTEGRATED CIRCUIT WITH RE-ROUTE LAYER AND STACKED DIE ASSEMBLY

(75) Inventors: Jochen Thomas, Munich (DE); Peter Weitz, Sauerlach (DE); Jurgen Grafe, Dresden (DE); Harry Hedler, Germering (DE); Jens Pohl, Bernhardswald (DE)

(73) Assignee: Qimonda AG, Munich (DE)

( * ) Notice: Subject to any disclaimer, the term of this patent is extended or adjusted under 35 U.S.C. 154(b) by 47 days.

(21) Appl. No.: 12/116,079

(22) Filed: May 6, 2008

(65) Prior Publication Data
US 2008/0203575 A1    Aug. 28, 2008

Related U.S. Application Data

(62) Division of application No. 10/790,907, filed on Mar. 2, 2004, now Pat. No. 7,422,930.

(51) Int. Cl.
*H01L 23/02* (2006.01)
(52) U.S. Cl. .......... 257/686; 257/691; 257/777
(58) Field of Classification Search .......... 257/686, 257/777
See application file for complete search history.

(56) References Cited

U.S. PATENT DOCUMENTS

| 4,439,841 | A | * | 3/1984 | Itoh et al. | 365/51 |
| 5,982,659 | A | * | 11/1999 | Irrinki et al. | 365/168 |
| 6,093,970 | A | * | 7/2000 | Ohsawa et al. | 257/777 |
| 6,291,881 | B1 | | 9/2001 | Yang | |
| 6,492,198 | B2 | | 12/2002 | Hwang | |
| 6,495,442 | B1 | | 12/2002 | Lin et al. | |
| 6,514,794 | B2 | | 2/2003 | Haba et al. | |
| 6,555,917 | B1 | | 4/2003 | Heo | |
| 6,560,117 | B2 | | 5/2003 | Moon | |
| 6,569,762 | B2 | | 5/2003 | Kong | |
| 6,582,992 | B2 | | 6/2003 | Poo et al. | |
| 6,607,938 | B2 | | 8/2003 | Kwon et al. | |
| 6,611,052 | B2 | | 8/2003 | Poo et al. | |
| 6,621,169 | B2 | | 9/2003 | Kikuma et al. | |
| 6,633,183 | B2 | | 10/2003 | Duesman | |
| 6,650,008 | B2 | | 11/2003 | Tsai et al. | |

(Continued)

FOREIGN PATENT DOCUMENTS

DE    101 46 176 A1    4/2003

(Continued)

OTHER PUBLICATIONS

Kim, G., "Pad-On-Circuit (PoC) Process and Its Application," 10th Annual International KGD Packaging & Test Workshop, Sep. 8-10, 2003, 27 pages, Napa, CA.

*Primary Examiner* — Wael M Fahmy
*Assistant Examiner* — Abul Kalam
(74) *Attorney, Agent, or Firm* — John S. Economou

(57) ABSTRACT

An apparatus and a method of manufacture for a stacked-die assembly. A first die is placed on a substrate such that the backside of the die, i.e., the side opposite the side with the bond pads, is coupled to the substrate, preferably by an adhesive. Wire leads electrically couple the bond pads of the first die to contacts on the substrate. A second die is placed on the first die, and wire leads electrically couple the bond pads of the second die to contacts on the substrate. Preferably, a spacer is placed between the first die and the second die. Additional dies may be stacked on the second die.

44 Claims, 11 Drawing Sheets

U.S. PATENT DOCUMENTS

| | | |
|---|---|---|
| 6,867,479 B2 | 3/2005 | Hübner |
| 2002/0093082 A1* | 7/2002 | Miyamoto et al. ............ 257/678 |
| 2002/0109216 A1* | 8/2002 | Matsuzaki et al. ............ 257/686 |
| 2002/0180023 A1* | 12/2002 | Her et al. ...................... 257/686 |
| 2003/0011068 A1* | 1/2003 | Song et al. ................... 257/723 |
| 2003/0020151 A1 | 1/2003 | Chen et al. |
| 2003/0034563 A1 | 2/2003 | Reyes et al. |
| 2003/0057539 A1 | 3/2003 | Koopmans |
| 2003/0107119 A1 | 6/2003 | Kim |
| 2003/0153122 A1 | 8/2003 | Brooks |
| 2003/0160312 A1 | 8/2003 | Lo et al. |
| 2003/0189256 A1* | 10/2003 | Corisis et al. ................. 257/777 |
| 2003/0203537 A1 | 10/2003 | Koopmans |
| 2003/0227079 A1* | 12/2003 | Chia et al. ..................... 257/723 |
| 2004/0113256 A1* | 6/2004 | Thomas et al. ............... 257/686 |
| 2004/0126927 A1* | 7/2004 | Lin et al. ...................... 438/107 |

FOREIGN PATENT DOCUMENTS

| | | |
|---|---|---|
| EP | 0 993 045 A1 | 4/2000 |

\* cited by examiner

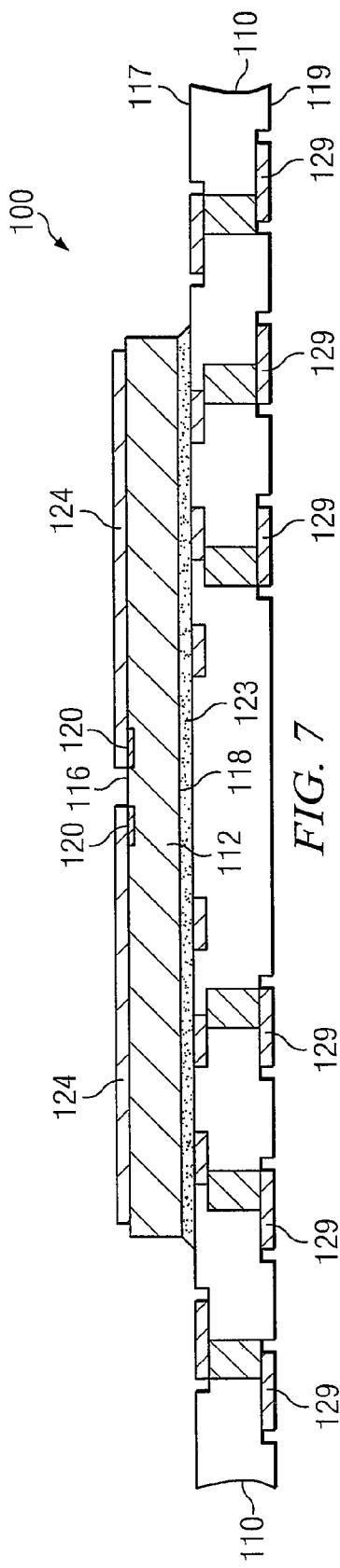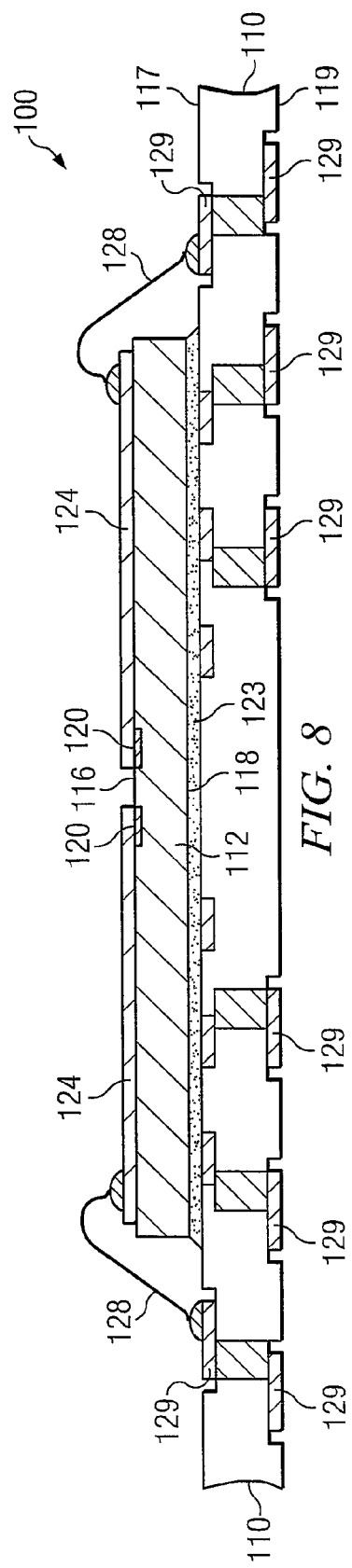

INTEGRATED CIRCUIT WITH RE-ROUTE LAYER AND STACKED DIE ASSEMBLY

This application is a divisional of U.S. patent application Ser. No. 10/790,907, filed Mar. 2, 2004, now U.S. Pat. No. 7,422,930 and entitled "Integrated Circuit with Re-Routed Layer and Stacked Die Assembly," which application is hereby incorporated herein by reference.

TECHNICAL FIELD

The present invention relates to the field of semiconductor devices, and more specifically, to an integrated circuit with a re-route layer and to a stacked-die assembly.

BACKGROUND

Most electronic devices in use today include many "chips" interconnected to provide a specific functionality. The chips generally comprise a semiconductor die embedded in a package, wherein each die may comprise an integrated circuit formed by standard semiconductor fabrication processes. The semiconductor die typically has a series of bond pads, which are used to make electrical contact to the integrated circuit formed therein. The die is placed on a carrier or substrate that has electrical leads formed therein to correspond to the bond pads of the die. The die and the carrier are enclosed to protect the die from the environment. To increase the density of the integrated circuits, it is often desirable to stack dies such that two or more dies may be placed in the area of a single die on top of each other.

For example, high-end memory applications such as server applications or high-end mobile applications increasingly require higher memory densities. High memory density is traditionally obtained by either stacking packages on top of each other or by placing more memory components on the memory module. The density of some memory structures, however, may not be increased in this manner. For example, Double Data Rate II (DDRII) designs require low electrical parasitics of the overall package solution as well as a minimally small difference between dies to achieve high data rates of 400 Mbps to 800 Mbps, and higher. Stacking DDRII die adversely affects the operation because the upper chip has a longer net length to a defined merger point in the memory module than the bottom chip. The high-speed architecture also prohibits the placing of the memory components with a different distance to the module connector, because the stub length has to be kept constant for each component.

Another technical problem to be overcome in the case of stacking memory dies is the placement of the bond pads. Unlike logic dies that have bond pads along the periphery of the die, memory typically has bond pads in the center of the die. This arrangement restricts the accessibility of the bond pads when another die is placed on top of the bond pads of a lower die.

SUMMARY OF THE INVENTION

These and other problems are generally reduced, solved or circumvented, and technical advantages are generally achieved, by embodiments of the present invention which provide a stacked-die assembly.

In one embodiment of the present invention, an assembly includes a plurality of dies within a package. In particular, the assembly includes a substrate with a number of contact pads and at least a first semiconductor device and a second semiconductor device. Each device has a first side and a second side and is positioned such that the second side is facing the surface of the substrate. The first side includes a number of bond pads formed in an interior region of the device and also includes a redistribution layer with re-routing lines that electrically couple the bond pads to re-routed bond pads in a periphery region of the device. The first and second semiconductor devices are preferably, but not necessarily, identical in structure. A first plurality of wires electrically couple re-routed bond pads of the first semiconductor device to contact pads of the substrate and a second plurality of wires electrically couple re-routed bond pads of the second semiconductor device to contact pads of the substrate. In the preferred embodiment, most contact pads of the substrate are coupled to re-routed bond pads of both the first and second semiconductor devices.

In the preferred embodiment, the first and second semiconductor devices are dynamic random access memory devices. For example, these devices could be double-data rate DRAMs and could have a capacity of at least 512 Mb of memory cells, e.g., 1 Gb or more. Concepts of the present invention would also apply to other types of semiconductor devices.

In another embodiment, both the first and second semiconductor devices have bond pads positioned in a left side and a right side of a first line of the device. In this embodiment, the redistribution layer routes a plurality of bond pads from the right side across the first line to corresponding re-routed bond pads on the left side of the semiconductor device and also routes a plurality of bond pads from the left side across the first line to corresponding re-routed bond pads on the right side of the semiconductor device.

In yet another embodiment, the redistribution layer of each of the first and second semiconductor devices includes a ground plane. The ground plane can include a line substantially surrounding the bond pads and a plurality of ground lines between or on either side of some of the re-routing lines. For example, when some of the bond pads correspond to data input/output bond pads, it is preferable to have the ground lines between or on either side of the re-routing lines that are electrically coupled to the data input/output bond pads.

In yet another embodiment, both the first and second semiconductor devices have elongated re-routed bond pads that extend from an edge of the semiconductor device toward the center region of the semiconductor device. The wires that are attached to the re-routed bond pads of the first device are attached at a portion of the re-routed bond pads nearer the edge while the wires attached to the second device are attached to the re-routed bond pads at a portion of the re-routed bond pad nearer the center region. Various ones of these embodiments can be combined.

BRIEF DESCRIPTION OF THE DRAWINGS

For a more complete understanding of the present invention, and the advantages thereof, reference is now made to the following descriptions taken in conjunction with the accompanying drawings, in which:

FIGS. 7-12 are cross-section views of a stacked-die assembly after various process steps have been performed in accordance with one embodiment of the present invention.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention. For example, one embodiment of the present invention disclosed herein is a stacked die configuration for DRAM dies. Embodiments of the present invention, however, may be utilized with other types of dies or assemblies in which it is desirable to re-route one or more of the bond pads.

Figure 1:
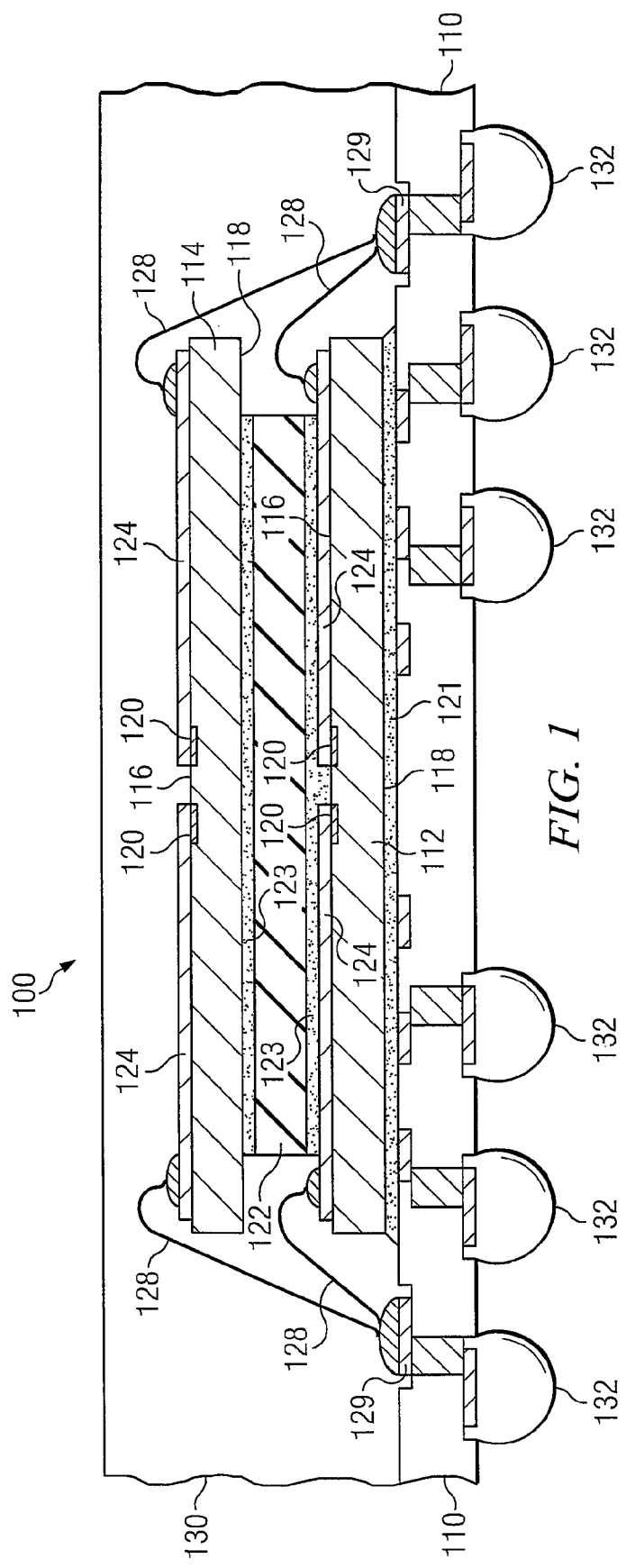
FIG. 1 is a cross-section view of a stacked-die assembly in accordance with one embodiment of the present invention.

Referring to FIG. 1, a cross-section view of a stacked-die assembly 100 is shown in accordance with one embodiment of the present invention. The stacked-die assembly 100 comprises a substrate 110, a first die 112, and a second die 114. It should be noted that while FIG. 1 illustrates a configuration in which two dies are stacked on top of each other, one skilled in the art will appreciate that embodiments of the present invention may be utilized to stack three or more dies to obtain greater densities. Advantageously, in the preferred embodiment the two dies 112 and 114 are identical in structure. The choice of which die is on top and which die is on bottom is purely arbitrary, thereby simplifying inventory issues.

Each of the first die 112 and the second die 114 has a first side 116 and a second side 118. The first side 116 of each of the first die 112 and the second die 114 have bond pads 120 and a redistribution layer 124 formed thereon. As will be explained in greater detail below, the redistribution layer 124 re-routes or electrically couples the bond pads 120 to the periphery region of the die. (In this description, contact regions 120 are referred to as "bond pads" even though, in the preferred embodiment, they are never actually bonded to.)

In the preferred embodiment, the first die 112 is attached to the substrate 110 with an adhesive 121 such that the second side 118 is facing the substrate 110. A spacer 122 is provided on the first die 112 above the redistribution layer 124, and the second die 114 is provided above the spacer 122. The second die 114 is oriented such that the second side 118 of the second die 114 is facing the spacer 122. In one embodiment, the spacer 122 is attached to the first die 112 and/or the second die 114 by adhesive layer 123. The first and second dies 112, 114 are preferably oriented identically to one another so that common pads are aligned.

Wire leads 128 electrically couple the bond pads 120 to contacts 129 on the substrate 110 via the redistribution layer 124. In other words, the bond pads 120 are re-routed to the periphery region of the die by the redistribution layer 124, which is then electrically coupled to contacts 129 by the wire leads 128. An encapsulation 130 preferably encases the first die 112, the second die 114, and the wire leads 128 to protect the components from damage by external objects and the environment. Solder balls 132 may be used to electrically couple the stacked-die assembly 100 to a device substrate (not shown).

Figure 2A:
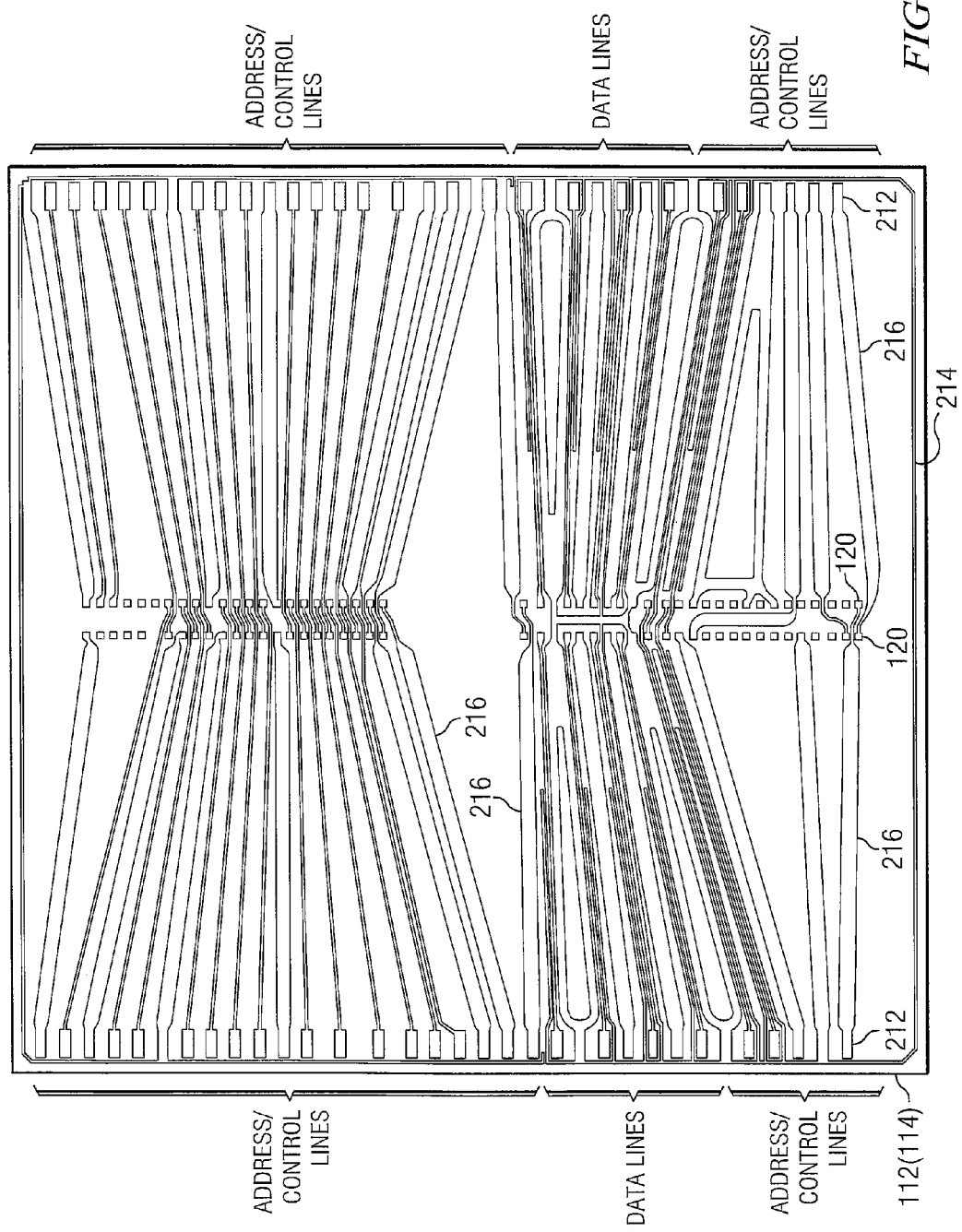
FIG. 2a is a plan view of a redistribution layer in accordance with one embodiment of the present invention.

FIG. 2a is a plan view of one example of the redistribution layer 124 (FIG. 1) in accordance with an embodiment of the present invention. A method of forming the redistribution layer 124 is discussed below with reference to FIGS. 3a-6c.

In the illustrated embodiment, the redistribution layer 124 includes bond pads 120 arranged in two columns running down a center line of the die. The bond pads 120 are electrically coupled to re-routed bond pads 212 via re-route lines 216. The re-routed bond pads 212 provide an electrical connection along the periphery of the die to the bond pads 120 located in the interior region. The redistribution layer 124 preferably includes a ground plane 214 that substantially encircles the periphery of the redistribution layer 124 to prevent noise from the environment from adversely affecting the operation of the electronic circuit (not shown).

In the embodiment illustrated in FIG. 2a, which is a 512 Mb DRAM, the bond pads 120 provide electrical connections to data lines and address/control lines. To simplify the fabrication process, it is desirable to design the assembly such that a single substrate 110 (FIG. 1) can be used for both a single-die configuration in which the die is typically placed face down and a stacked-die configuration in which the die is placed face up. However, when the die is flipped or turned over, bond pads that were on the right side are on the left side and bond pads that were on the left side are on the right side. Accordingly, it is necessary to either modify the layout of the substrate or re-route the bond pads (or provide an update pinout specification to the user). Because the pinout is often standardized, e.g. by JEDEC or other standard setting organizations, it is usually preferred and advantageous to keep the existing standardized pinout. Often, the pinout for stacked products is just modified by the chip select balls, etc. against the standard pinout of a single die component. Furthermore, a standardized pinout is preferred because a single type of substrate may be used regardless whether stacking techniques are used.

In the preferred embodiment, only the address/control lines are routed from left-to-right and right-to-left. The address/control lines determine the relative location and the manner in which a memory location is accessed. The physical memory location, e.g., which capacitor/transistor stores the data for a particular relative memory location, is irrelevant from the standpoint of the user. Accordingly, the address/control lines should be routed from right-to-left and from left-to-right, but the data lines need not be switched. This configuration provides an additional advantage for a double data rate device where the data input/output points are operated at twice the clock rate and therefore benefit from the shorter lines. Thus, in FIG. 2a, the address/control lines are switched from right-to-left aid from left-to-right, and the data lines are not switched. It should be noted that not all of the pins in the embodiment illustrated in FIG. 2a are utilized, thus not all bond pads 120 are re-routed to the periphery of the die.

FIG. 2a illustrates another advantageous feature that can be utilized, i.e., the ground plane 214 includes ground lines that surround or at least partially separate the re-route lines 216 for the data input/outputs. It should be noted that the ground plane 214 maybe a single ground plane or a set of ground planes. For example, it may be advantageous to have a data supply ground (VSSQ) close to the data in/output signals, and a usual ground (VSS) close to the address/command signals. This ground plane 214 layout helps to electrically isolate the relatively high frequency lines, which can be especially useful for a double data rate SDRAM. Cross-talk and other electrical noise will be eliminated or reduced by the inclusion of the ground plane. Because the address/control lines operate at a lower (e.g., half) frequency, the ground plane does not need to surround or separate these lines. In an alternate embodiment, all of the re-route lines 216 are formed adjacent a ground line.

A further advantage of the surrounding ground line is to act as a barrier against contamination that may be introduced during the wafer singulation process. Due to the topography of the RDL (redistribution layer) lines, the chip may not be completely fixed to the sawing foil. Thus, during singulation rinsing water may penetrate on the chip areas not covered by RDL, resulting in non-removable residues. This might be adverse for further assembly as well as for reliability. The ground line around the chip acts as a barrier against this contamination. In case that there is more than one ground potential existing, the surrounding lines are shortly prolonged inwards at the meeting points. This is to maintain the different potentials and to act as further restriction against contamination penetration. Also other geometries (as shown in FIG. 2a) are thinkable, e.g. with additional angles.

Figure 2B:
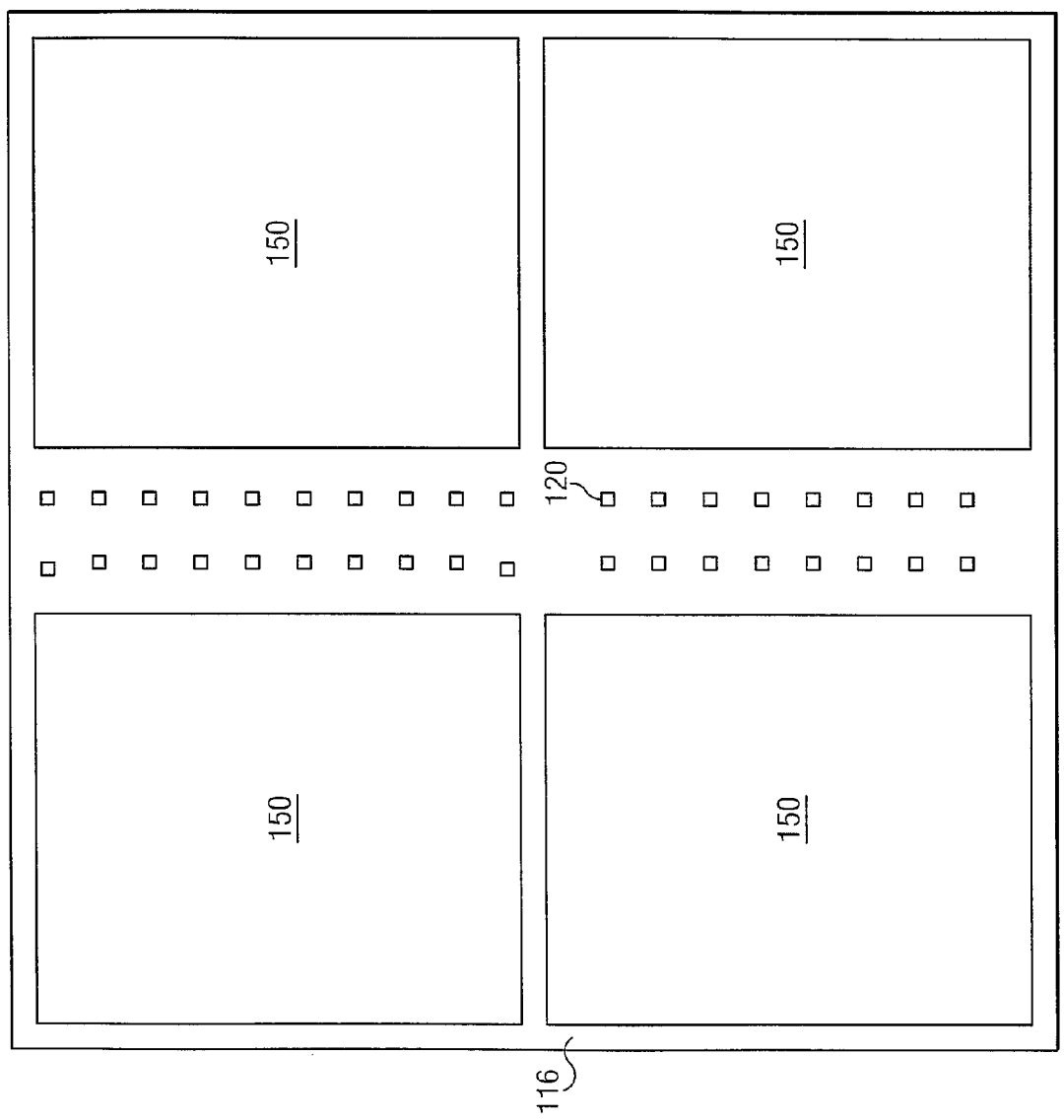
FIG. 2b is a plan view of a memory die in accordance with one embodiment of the present invention.

FIG. 2b illustrates the first side 116 of a memory die 112 (114), which is one example of a device that can utilize aspects of the present invention. Memory die 112 (114) is organized in four array sections 150. In one embodiment, each array section includes 256 k memory cells (plus redundant cells) for a 1 Gb memory device. Aspects of the present invention are especially useful with high-density memory devices (e.g., 1 Gb or more memory) because these memory cells typically operate at high speeds and can benefit from advantages taught herein.

FIGS. 3a-6c illustrate various views of a die 300, such as die 112, 114 of FIG. 1, after various process steps have been performed to fabricate a redistribution layer on a semiconductor die in accordance with one embodiment of the present invention. It should be further noted that the portion of the die illustrated comprises the re-routing of address/control lines, which, as discussed above, may need to be re-routed from left to right and from right to left. The process described herein may also be utilized to form a redistribution layer to re-route data lines, which may not need to be re-routed from left to right and from right to left.

Figure 3A:
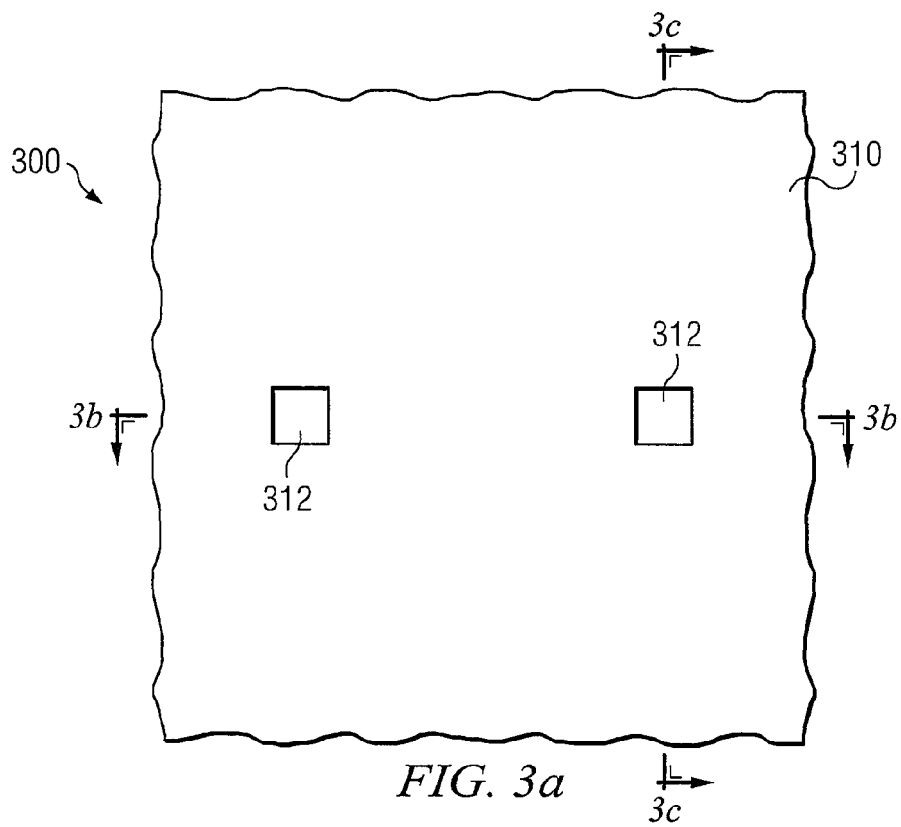
FIGS. 3a-6c are plan and cross-section views of a wafer after various process steps have been performed in accordance with one embodiment of the present invention.
Figure 3B:
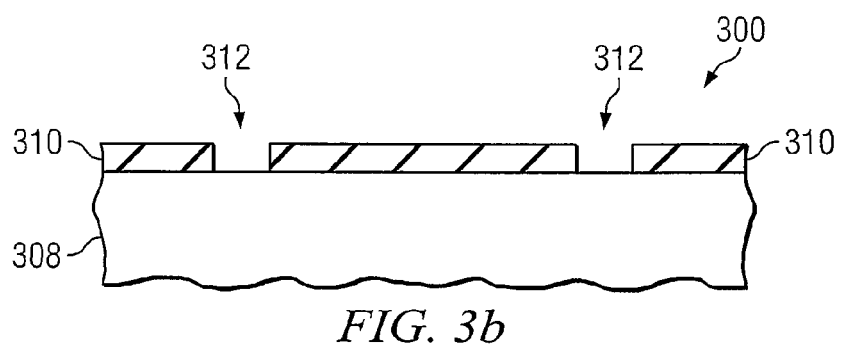
Figure 3C:
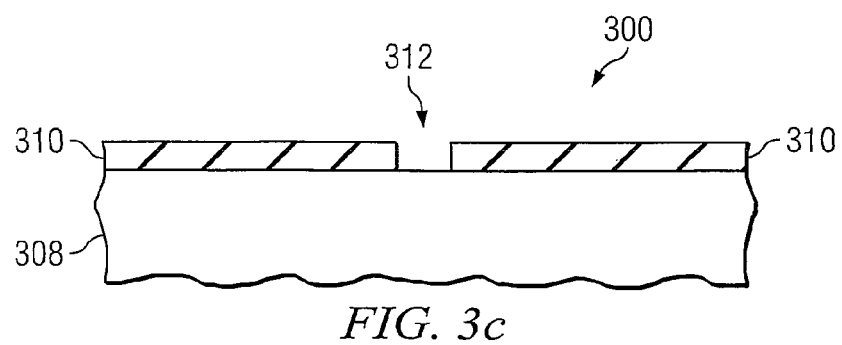

The process begins is FIGS. 3a-3c, in which a wafer is provided having an integrated circuit formed thereon, wherein FIG. 3a is a plan view and FIGS. 3b-3c are cross-section views along the axis indicated in FIG. 3a. Generally, the die 300 includes a substrate 308 having integrated circuits (not shown), such as a DRAM, formed therein. The substrate 308, and the integrated circuits formed therein, may be fabricated using standard semiconductor processing techniques known in the art.

The die 300 typically has a protective layer 310, preferably polyimide, formed on the surface of the die 300 to protect the top-most metal layer (not shown) or other components from damage and the environment. Contact pads 312 are exposed in the protective layer 310 to provide electrical contact to the underlying structures (not shown), e.g., integrated circuits.

Figure 4A:
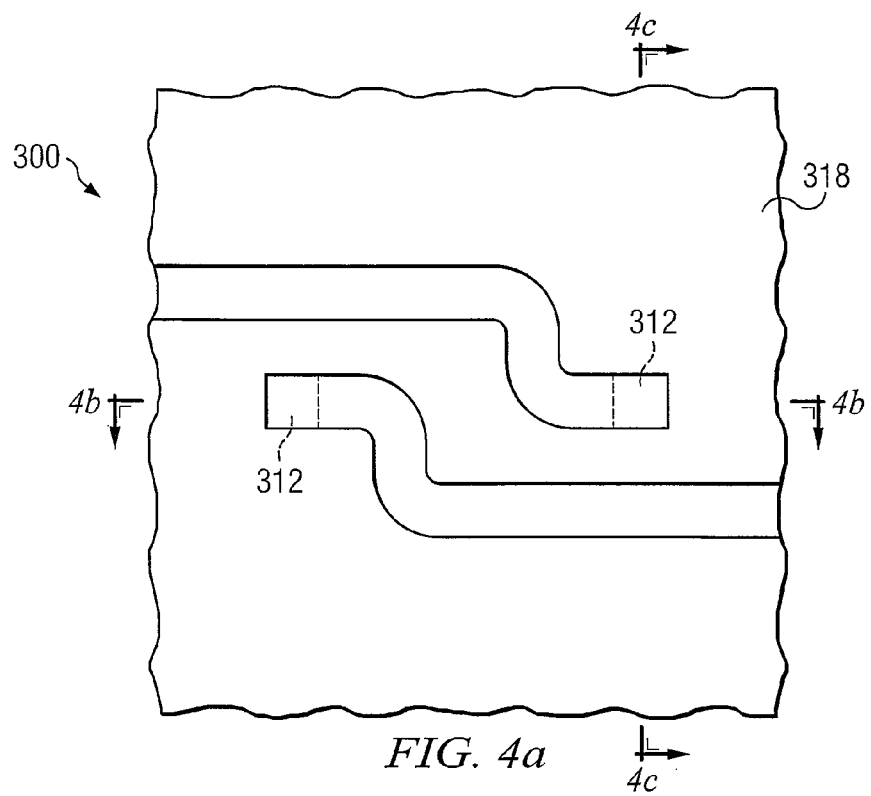
Figure 4B:
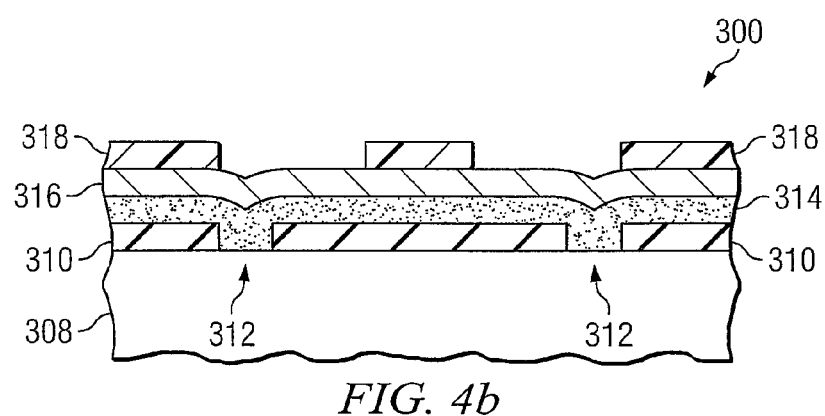
Figure 4C:
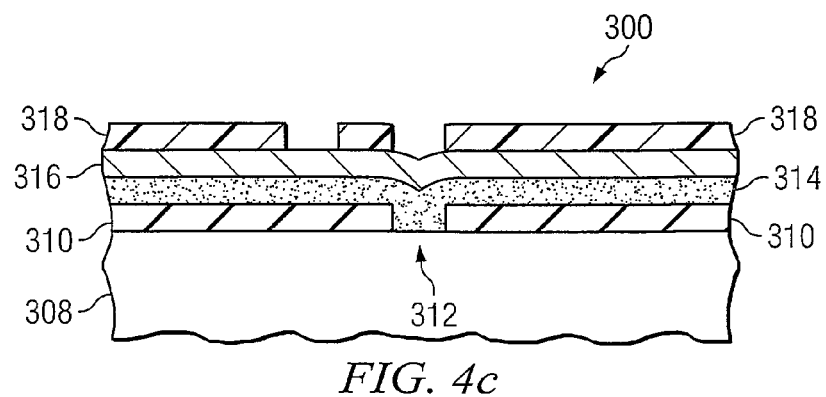

The protective layer 310 may further include an optional dielectric layer (not shown) to provide lower coupling between the redistribution layer and the uppermost metal layer (not shown), and to provide better electrical parasitics. The optional dielectric layer may be a polyimide, an oxide, or the like, but is preferably a material requiring low process temperatures, such as WPR, BCB (e.g., benzocyclobutene based polymer dielectric), Probelec. In the preferred embodiment in which the dielectric layer is formed of PI, the dielectric layer may be formed by spin coating at a temperature of about 320° C. to a thickness of about 3 um to about 6 um. There can also be an additional dielectric layer, e.g. WPR of about 5 um to about 15 um or more that may be formed by spin coating; the curing temperature is 150° C. FIGS. 4a-4c illustrate die 300 of FIGS. 3a-3c after an adhesion layer 314 and a first conductive layer 316 have been formed and patterned. Generally, the adhesion layer 314 provides good adhesive qualities between the protective layer 310 and the first conductive layer 316. In one embodiment, the adhesion layer 314 is titanium formed, for example, by sputtering using a source power density ranging from about 3 watts/cm2 to about 6 watts/cm2 with a sputter rate from 2 to 6 nm/s with a sputtering gas of Ar and a sputtering material of Ti. Preferably, the titanium adhesion layer 314 is about 50 nm to about 100 nm in thickness, and more preferably about 70 nm in thickness. Other materials, such as Cr, TiN, may also be used.

The first conductive layer 316 is preferably formed on the adhesion layer 314 to provide enhanced electrical characteristics. In one embodiment, the first conductive layer 316 is formed of copper, which may be formed, for example, by sputtering using a source power density ranging from about 3 watts/cm2 to about 6 watts/cm2 with a sputter rate of 3 to 6 nm/s and with a sputtering gas of Ar and a sputtering material of Cu. Preferably, the first conductive layer 316 is about 100 nm to about 400 nm in thickness, and more preferably about 200 nm in thickness.

The adhesion layer 314 and the first conductive layer 316 are preferably patterned using standard photolithography techniques known in the art. Generally, photolithography involves depositing a photoresist material 318, which is then masked, exposed, and developed to remove portions of the photoresist material. The removed portions of the photoresist material defines the pattern of the redistribution layer, e.g., defines the re-routing of the bond pads from the interior region of the die to the periphery region of the die. Preferably, the photoresist material also defines the ground plane.

Figure 5A:
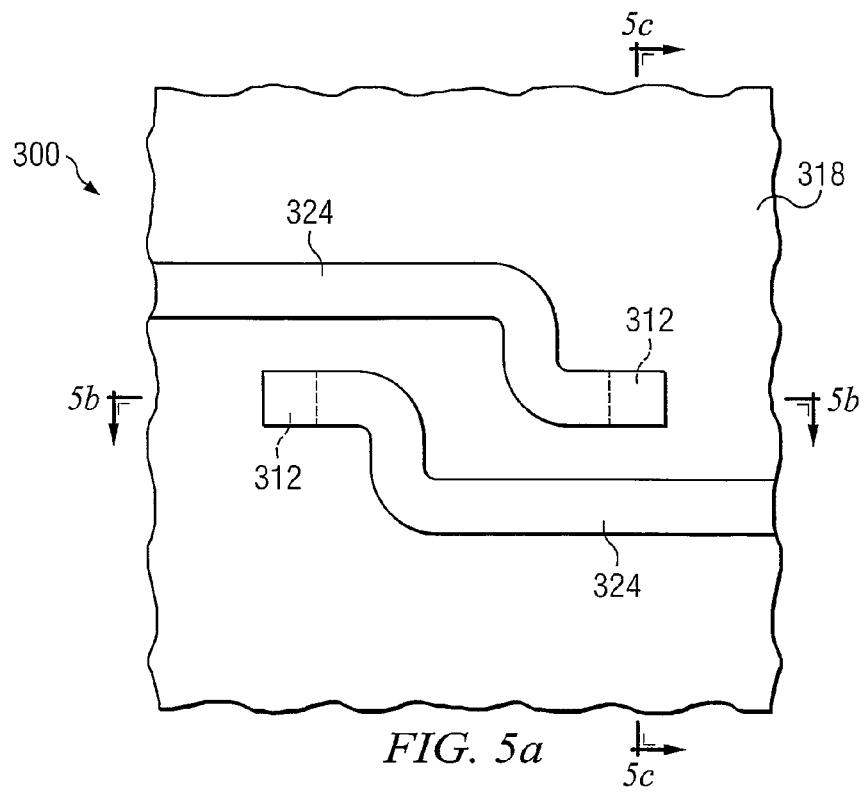
Figure 5B:
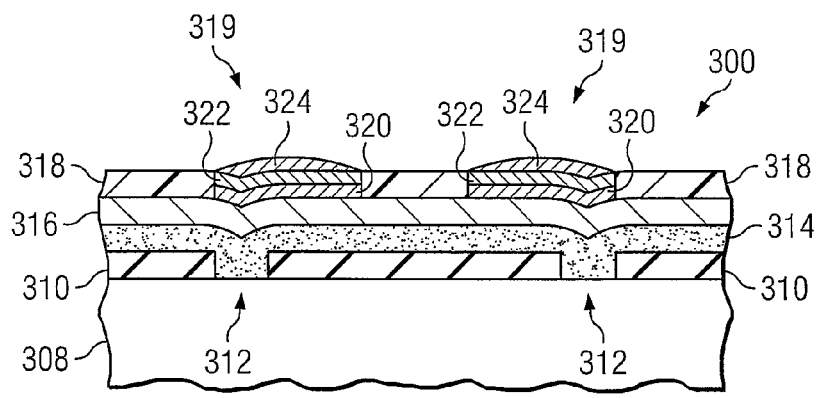
Figure 5C:
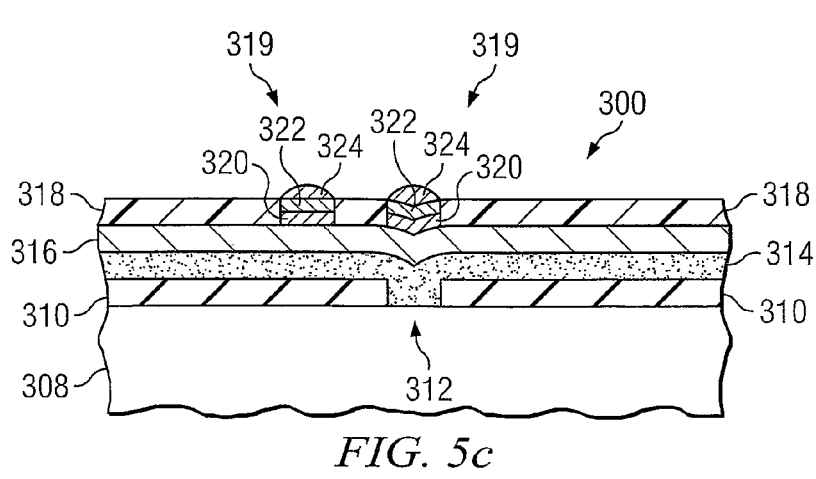

FIGS. 5a-5c illustrate die 300 of FIGS. 4a-4c after a second conductive layer 319 has been formed over the contact pad 312. In the preferred embodiment, the conductive layer 319 is a multi-layer structure comprising a copper layer 320, a nickel layer 322, and a gold layer 324. Generally, the copper layer 320 provides good conductivity, and the gold layer 324 provides a conductive material that has good bonding characteristics for bonding wire leads to the redistribution layer (discussed in greater detail below with reference to FIGS. 7-12). Due to its hardness, the nickel layer 322 provides mechanical stability to the gold layer 324 and wafer processing. The nickel layer 322 also acts as a protective layer for the active areas and other underlying structures formed in the die. Alternatively, the conductive layer 320 may be formed of aluminum. Other materials, however, may be used.

The use of a photoresist material 318 deposited and patterned on the first conductive layer 316 prevents the copper, nickel, and gold from adhering to the wafer. As discussed above, the photoresist material 318 was patterned such that the first conductive layer 316 was exposed where the redistribution lines are desired.

In one embodiment, the copper layer 320 is formed by electroplating. Preferably, the copper layer 320 is about 2 um to about 10 um in thickness, but more preferably about 5 um in thickness.

Additionally, the nickel layer 322 and the gold layer 324 may be electroplated. Preferably, the nickel layer 322 is about 1 um to about 5 um in thickness, but more preferably about 2 um in thickness. Preferably, the gold layer 324 is about 0.1 um to about 1 um in thickness, but more preferably about 0.5 um in thickness.

Figure 6A:
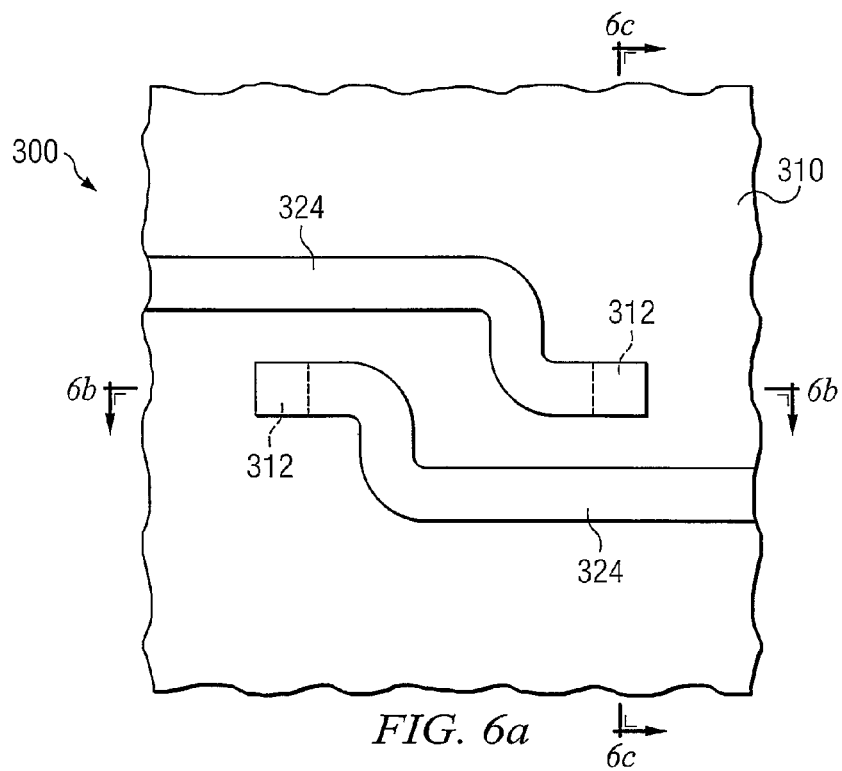
Figure 6B:
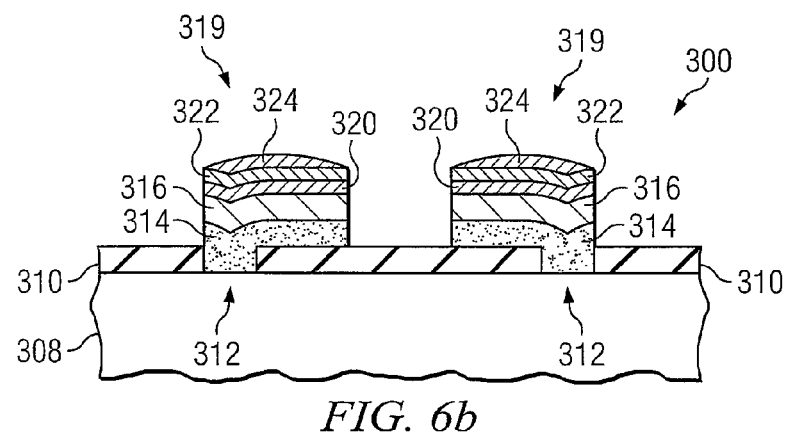
Figure 6C:
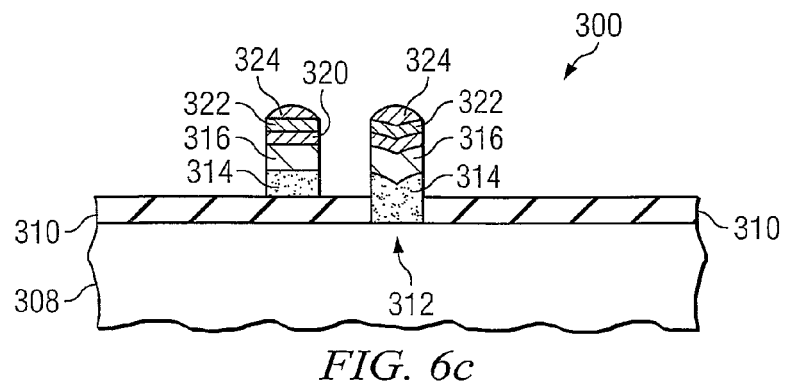

FIGS. 6a-6c illustrate die 300 of FIGS. 5a-5c after the photoresist material 318 and the excess material of the adhesion layer 314 and the first conductive layer 316 are removed.

The photoresist material may be removed, for example, by a wet dip in conventional resist stripper. After the photoresist material has been removed, the first conductive layer 316 may be removed by a Cu etchant and the adhesion layer 314 may be removed, for example, by 0.25% HF.

After the redistribution lines are formed, the backside of the die 300 can be grinded down so that the overall device is of the desired thickness. For example, the thickness can be reduced by about 600 µm so that the overall thickness of the device is about 1.2 to 1.25 mm or smaller, for a stack with two memory chips plus one spacer. Thereafter, the die 300 is processed in accordance with standard techniques to prepare the individual die for packaging.

FIGS. 7-12 illustrate cross-section views of steps that may be performed to form a stacked die assembly 100 in accordance with one embodiment of the present invention. The process begins in FIG. 7, wherein a first die 112 having a redistribution layer 124 is attached to a substrate 110. The substrate 110 illustrated in FIGS. 7-12 is preferably a two-layer substrate commonly used in the industry having contacts 129 formed from a first side 117 through the substrate 110 to a second side 119. In the preferred embodiment, a number (e.g., fifteen) of substrates are formed in a single substrate unit, these will be separated after the dies are attached.

The first die 112 has a first side 116, upon which the redistribution layer 124 has been formed, and a second side 118. As discussed above, the redistribution layer 124 re-routes bond pads 120 from the interior region of the die to the periphery region of the die. One example of forming the redistribution layer 124 is discussed above with reference to FIGS. 3a-6c.

The first die 112 is attached to the substrate 110 such that the second side 118 of the first die 112 is attached to the first side 117 of the substrate 110. The first die 112 may be attached to the substrate 110 by any adhesive means or techniques. For example, in the embodiment illustrated in FIG. 7 the first die 112 is attached to the substrate 110 by an adhesive layer 123, which may be applied by utilizing adhesive tape or printing techniques known in the art, or the like.

FIG. 8 illustrates the stacked die assembly 100 of FIG. 7 after wire leads 128 have been attached to electrically couple the redistributed bond pads formed in the redistribution layer 124 to contacts 129 on the substrate 110 in accordance with one embodiment of the present invention. The wire leads 128 are preferably a gold wire having a diameter of about 15 to 25 µm. It has been found that wire leads 128 formed of gold provide good properties for bonding to the redistribution layer, the top layer of which is preferably gold. The wire leads 128 may be attached to the redistribution layer 124 and the contacts 129 by, for example, standard wire bonding techniques.

Figure 9:
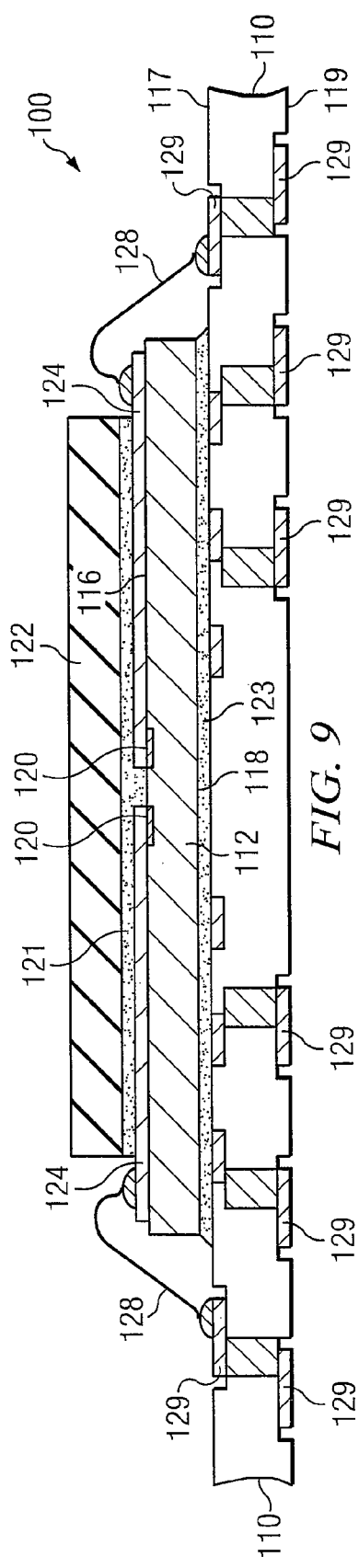

FIG. 9 illustrates the stacked die assembly 100 of FIG. 8 after a spacer 122 has been attached to the first die 112. The spacer 122 provides a gap between the first die 112 and a second die that is to be stacked above the first die 112 in a subsequent step, preventing damage to the wire leads 128. The spacer 122 is preferably composed of an electrically-insulative material, such as silicon or the like, to prevent or reduce any electrical conductance between the first die 112 and other dies stacked above the first die 112. Silicon is useful because it has identical thermal properties as the silicon dies 112 and 114. The silicon spacer does not typically have any circuitry formed therein. Preferably, the spacer 122 is at least about 50 to about 150 µm in thickness, but more preferably about 100 µm. The spacer 122 is attached to the first die 112 by adhesive 121, which may be applied, for example, by tape or printing techniques known in the art.

In another embodiment, the dies are different sides and positioned such that a spacer is not needed. For example, if the bottom die is larger than the top die, the re-routed bond pads on the first die may be exposed. In this situation, a spacer may not be necessary and the top die may be placed directly on the bottom die.

Figure 10:
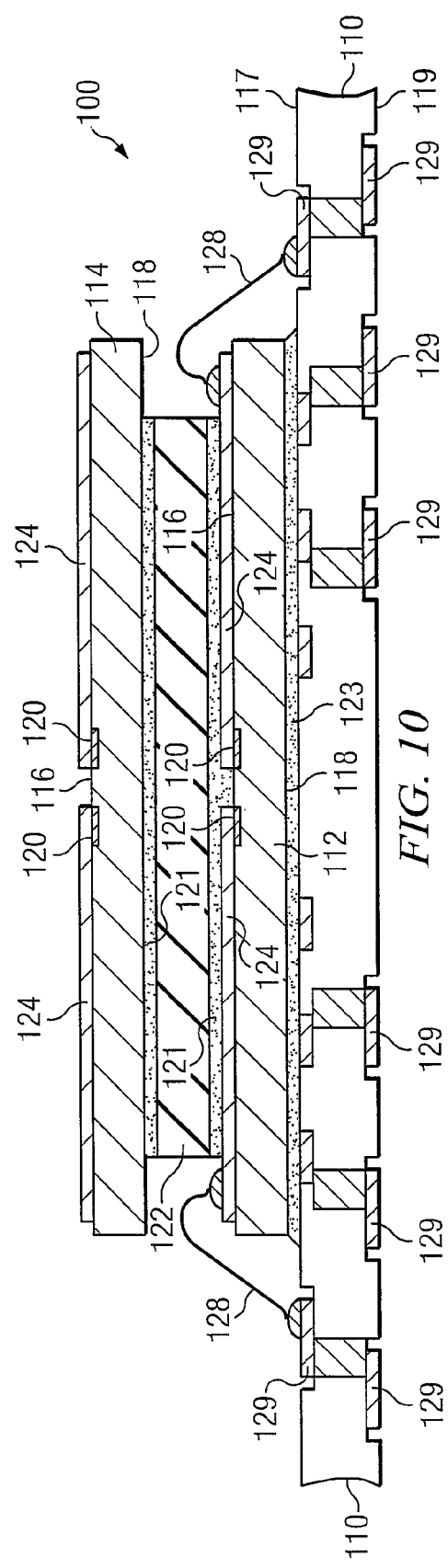

FIG. 10 illustrates the stacked die assembly 100 of FIG. 9 after a second die 114 has been stacked above the first die 112. Similar to the first die 112, the second die 114 has a first side 116, upon which a redistribution layer 124 has been formed, and a second side 118. The redistribution layer 124 re-routes bond pads 120 from the interior region of the die to the periphery region of the die. One example of forming the redistribution layer 124 is discussed above with reference to FIGS. 3a-6c.

The second die 114 is attached to the spacer 122 such that the second side 118 of the second die 114 is attached to the spacer 122. The second die 114 may be attached to the spacer 122 by an adhesive 121. The adhesive 121 may be applied by any technique known in the art. For example, the second die 114 may be attached to the spacer 122 by utilizing a printing process as well or an adhesive tape or printing techniques known in the art.

Figure 11A:
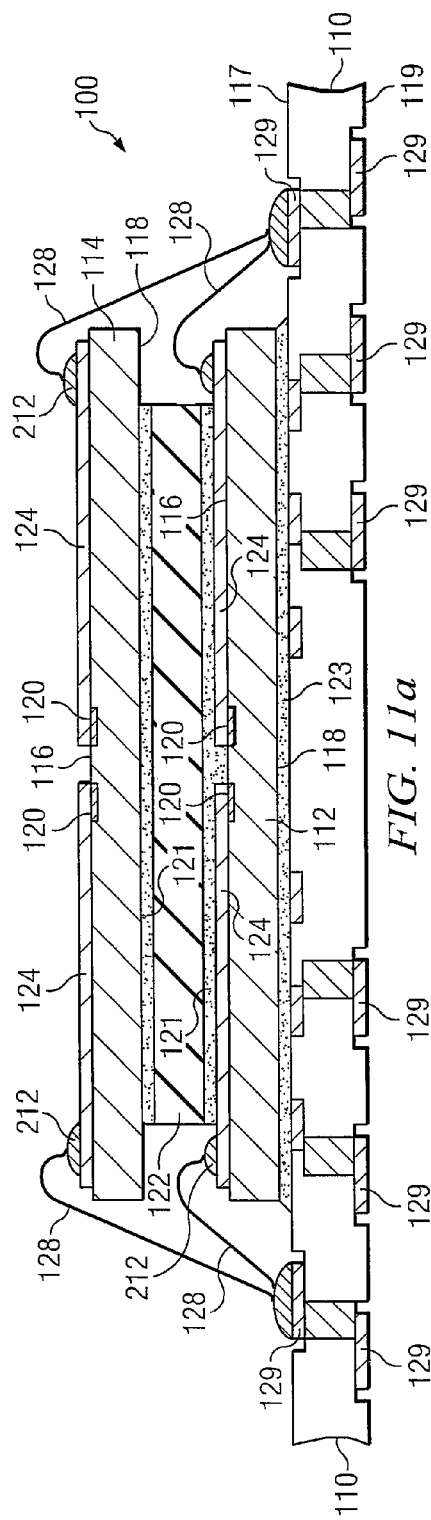
Figure 11B:
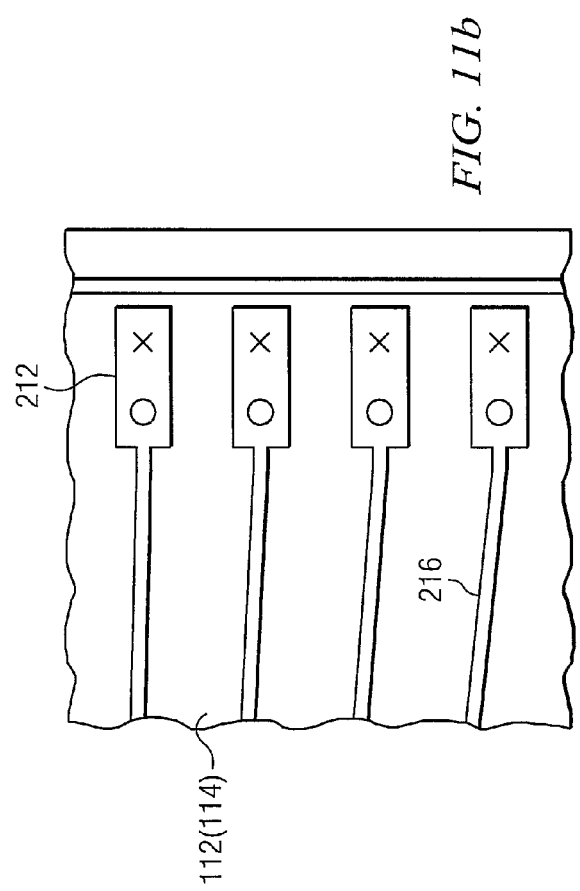

FIGS. 11a and 11b illustrate the stacked die assembly 100 of FIG. 10 after wire leads 128 have been attached to electrically couple the re-routed bond pads 212 of the redistribution layer 124 to the contacts 129 on the substrate 110 in accordance with one embodiment of the present invention. The wire leads 128 are preferably a gold wire having a diameter of about 15-25 µm. The wire leads 128 may be attached to the redistribution layer 124 and the contacts 129 by, for example, standard wire bonding techniques.

In the preferred embodiment, the corresponding re-routed bond pads 212 of the first die 112 and the second die 114 are attached to the same contact 129, except for a line or lines necessary for the system to differentiate between the top die and bottom die. In particular, it has been found that the same address/control lines and data lines may be electrically coupled to each die in a stacked die assembly provided that each die has a unique chip select signal, or an equivalent thereof. The die select signal enables or disables the selected die, effectively providing a means to turn a particular die on or off. Furthermore, it is preferred that each die have a unique clock enable signal and, particularly for a DDR II DRAM design, an on-die termination signal.

In the preferred embodiment, the wire leads 128 on the second die 114 are connected to the re-routed bond pads 212 of the redistribution layer further towards the center of the die 114 as shown in FIG. 11b. In FIG. 11b, the re-routed bond pads 212 are shown with an "O" where the second die 114 is bonded. In comparison, an "X" is provided where the first die 112 is bonded. In the preferred embodiment described above, the wire leads 128 are connected to the re-routed bond pads 212 of the redistribution layer 124 closer to the center of the second die 114. It has been found that connecting the wire leads in this manner reduces the mechanical stress imparted on the chip due to the overhang bonding. The distance that the wire leads 128 of the first die 112 may be moved toward the center of the first die 112 is limited by the size of the spacer 122. In the embodiment described herein in which the stacked die assembly comprises two dies, this may not be an issue. In other embodiments, such as, for example, embodiments in which three or more dies are stacked or the die is thinner, it may be desirable to reduce the size of the spacer such that the connection point of the wire lead may be moved more towards the center of the die to reduce the mechanical stress on the wire leads.

Figure 12:
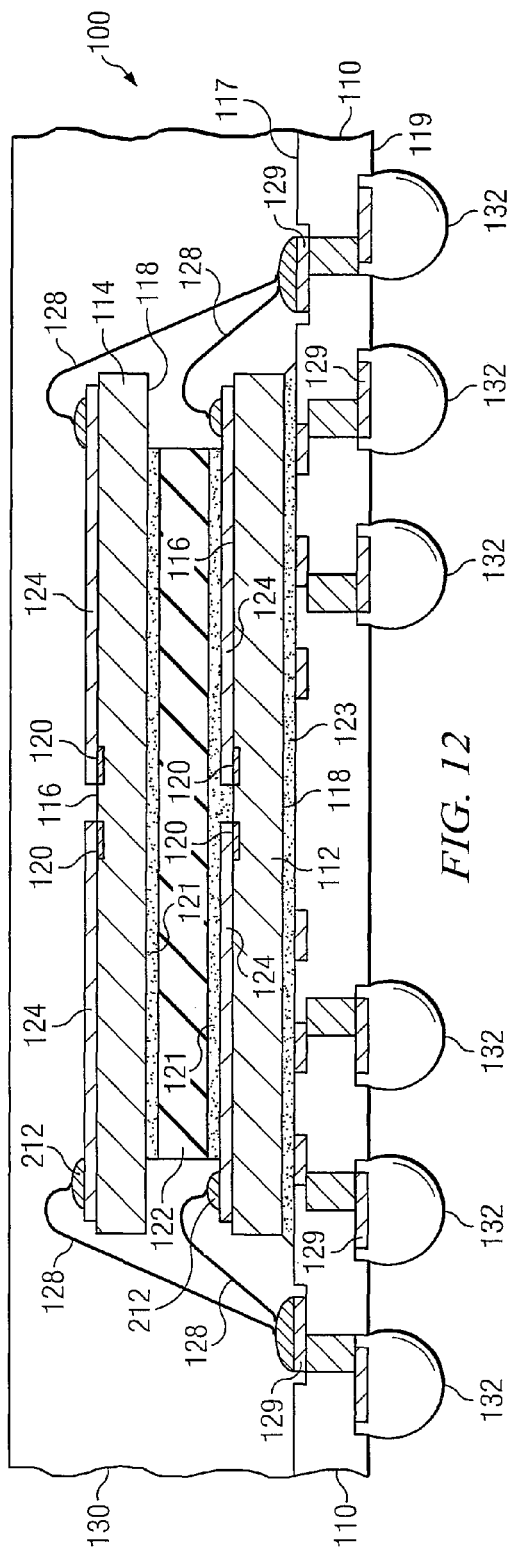

FIG. 12 illustrates the stacked die assembly 100 of FIG. 11a after an encapsulation 130 and solder balls 132 have been formed. The encapsulation 130 is a dielectric material that encases the dies 112,114 to provide protection from damage and the environment. The solder balls 132 provide a method of attaching the stacked-die assembly to, for example, a printed circuit board. Singulation of the stacked-die assembly may then be performed to complete processing.

Figure 13:
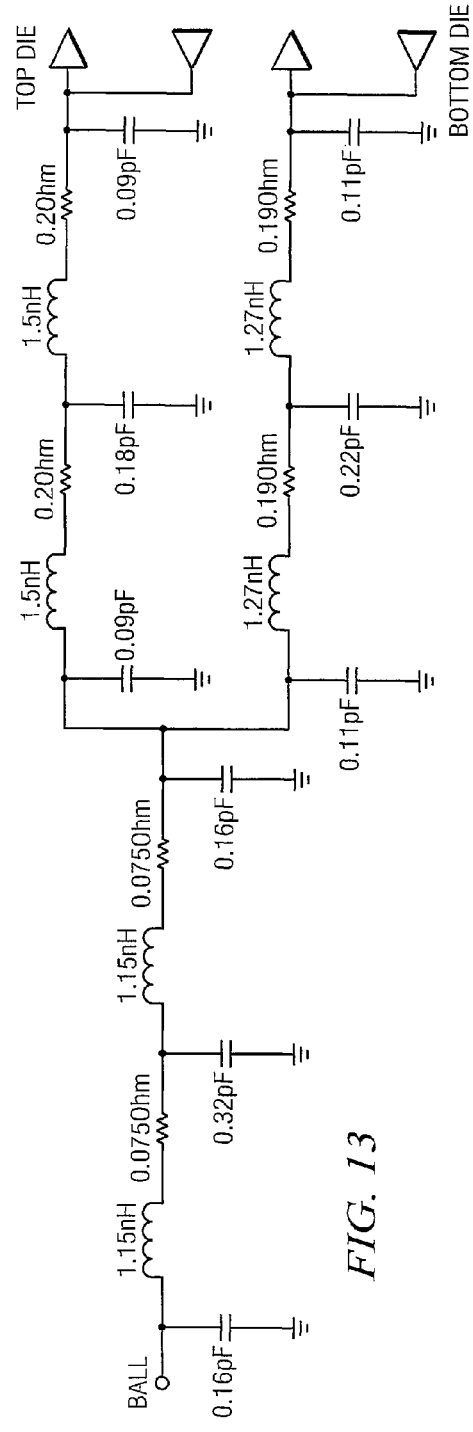
FIG. 13 is a schematic of the electrical parasitics of a stacked-die assembly in accordance with one embodiment of the present invention.

Tables 1 and 2 illustrate the simulated electrical characteristics of a single-die assembly and a stacked-die assembly, respectively. FIG. 13 is a schematic diagram of the stacked-die assembly parasitics.

TABLE 1

| | | Rii, [Ohms] | Lii, [H] | Cii, [F] |
|---|---|---|---|---|
| Data Lines | MIN | 0.2 | 2.39E−9 | 3.31E−13 |
| | MEAN | 0.21 | 3.14E−9 | 3.56E−13 |
| | MAX | 0.22 | 3.93E−9 | 3.76E−13 |
| Address/Control Lines | MIN | 0.17 | 2.05E−9 | 2.70E−13 |
| | MEAN | 0.18 | 2.52E−9 | 3.12E−13 |
| | MAX | 0.21 | 3.22E−9 | 3.64E−13 |

TABLE 2

| | | Upper Die | | | Bottom Die | | |
|---|---|---|---|---|---|---|---|
| | | Rii, [Ohms] | Lii, [H] | Cii, [F] | Rii [Ohms] | Lii, [H] | Cii, [F] |
| Data Lines | MIN | 0.57 | 4.35E−9 | 6.46E−13 | 0.54 | 4.02E−9 | 6.72E−13 |
| | MEAN | 0.6 | 4.90E−9 | 7.21E−13 | 0.55 | 4.28E−9 | 7.7E−13 |
| | MAX | 0.63 | 5.49E−9 | 7.57E−13 | 0.58 | 4.97E−9 | 8.26E−13 |
| Address/Control Lines | MIN | 0.44 | 5.7E−9 | 6.53E−13 | 0.42 | 4.83E−9 | 7.06E−13 |
| | MEAN | 0.5 | 6.04E−9 | 7.33E−13 | 0.53 | 5.3E−9 | 8.04E−13 |
| | MAX | 0.53 | 6.51E−9 | 7.83E−13 | 0.57 | 5.71E−9 | 8.79E−13 |

Each table lists the minimum, mean, and maximum package parasitic resistance (R), inductance (L), and capacitance (C) of the data lines and the address/control lines. As shown, the single-die assembly has a package parasitic resistance that ranges from about 0.17 to about 0.22 Ω, an inductance that ranges from about 2.05 to about 3.93 nH, and a capacitance from about 0.27 to about 0.36 pF. In comparison, the stacked-die assembly has a package parasitic resistance that ranges from about 0.42 to about 0.63 Ω, an inductance that ranges from about 4.02 to about 6.51 nH, and a capacitance from about 6.46 to about 8.79 pF. Due to the inherent dependence on trace length and width, the stated values can vary greatly. The length is usually defined by the chip width, and the trace width can be adjusted in accordance to the RDL design capabilities and to the desired electrical characteristics.

Tables 3 and 4 show the influence of various RDL trace geometries (100 μm/50μm/20 μm wide traces) and of additional dielectric layer (5 μm WPR). As can be seen, a reduced trace width leads to a reduction of capacitance. This is due to the smaller area of coupling to the underlying chip metallization. The inductance is not remarkably increased, because there is only a second order dependency of the trace width. The reduced trace width leads to an increased resistance for the RDL part of the total package resistance. For smaller RDL trace widths, e.g. 20 μm it might be beneficial to have a special chip fuse treatment to adjust overall package+chip resistance.

As can be seen in table 4, an additional dielectric also contributes to a capacitance reduction. This is caused by the larger distance between RDL and chip metallization and therefore reduced coupling. The optional dielectric has the advantage of offering reduced capacitance and at same time keeping inductance and especially resistance at desirable lower values.

TABLE 3

| | | Stackup | | | | | |
|---|---|---|---|---|---|---|---|
| | | 5 μmP1, w = 100 μm RDL | | | 5 μmP1, w = 50 μm RDL | | |
| I/O pins | Ball # | Rii [Ohm] | Lii [nH] | Cii [pF] | Rii [Ohm] | Lii [nH] | Cii [pF] |
| /RDQS | A2 | 1.25 | 5.88 | 6.96 | 1.60 | 6.03 | 4.38 |
| RDQS | B3 | 1.20 | 5.92 | 7.06 | 1.55 | 6.07 | 4.36 |
| DQ6 | B1 | 1.14 | 5.79 | 7.12 | 1.49 | 5.95 | 4.42 |
| DQ1 | C2 | 1.06 | 5.82 | 6.93 | 1.40 | 5.97 | 4.35 |
| DQ3 | D3 | 1.08 | 5.95 | 7.05 | 1.42 | 6.10 | 4.45 |
| DQ4 | D1 | 0.84 | 5.18 | 6.86 | 1.19 | 5.34 | 4.26 |

TABLE 4

| | | Stackup | | | | | |
|---|---|---|---|---|---|---|---|
| | | 5 μmP1, w = 20 μm, RDL | | | 5 μmP1 + 5 μm WPR, w = 50 μm | | |
| Stackup I/O pins | Ball # | Rii [Ohm] | Lii [nH] | Cii [pF] | Rii [Ohm] | Lii [nH] | Cii [pF] |
| /RDQS | A2 | 2.15 | 6.35 | 2.76 | 1.46 | 6.30 | 2.98 |
| RDQS | B3 | 2.10 | 6.36 | 2.78 | 1.41 | 6.33 | 2.94 |
| DQ6 | B1 | 2.04 | 6.25 | 2.80 | 1.35 | 6.21 | 2.98 |
| DQ1 | C2 | 1.96 | 6.29 | 2.69 | 1.27 | 6.24 | 2.93 |
| DQ3 | D3 | 1.98 | 6.40 | 2.85 | 1.29 | 6.36 | 2.99 |
| DQ4 | D1 | 1.75 | 5.66 | 2.62 | 1.06 | 5.60 | 2.84 |

Furthermore, the inductance mismatch between the upper die and the lower die is less than about 0.52 nH for data lines and less than about 0.8 nH for address/control lines. The inductance mismatch of the CK/NCK signal line has been simulated to be less than about 0.15 nH per die.

Table 5 compares the simulated thermal characteristics of a single-die assembly and a stacked-die assembly for a 2× 512 M DDR2 memory. The table illustrates the expected thermal characteristics for two types of substrates, a 1s0p substrate and a 2s2p substrate. In both cases, the stacked-die assembly provides slightly lower values of $\theta_{JA}$. The values were derived from thermal resistance simulation according to JEDEC standard JESD 51. The table shows that the Stacked Die Package has the same, or even slightly better, thermal performance per nominal overall power package as compared to the single die package. This is caused by the slightly higher number of balls (i.e. the additional chip select balls) and the slightly larger component width as compared to the single die package. The fact that the spacer consists of silicon as well, contributes to a highly equilibrated thermal behavior of the stacked die package.

TABLE 5

| Board type | Non-Stacked Package | | Stacked Package | |
| --- | --- | --- | --- | --- |
| | 1s0p | 2s2p | 1s0p | 2s2p |
| $\theta_{JA}$ (K/W) | 65 | 38 | 61 | 35 |

Although particular embodiments of the invention have been described in detail, it is understood that the invention is not limited correspondingly in scope, but includes all changes, modifications, and equivalents coming within the spirit and terms of the claims appended hereto. For example, the types of materials used may be modified or changed, the layout of the redistribution layer may be modified, the bond pad locations on the die may be changed, the contacts on the substrate may be changed, and the like. Accordingly, it is understood that this invention may be extended to other structures and materials, and thus, the specification and figures are to be regarded in an illustrative rather than a restrictive sense.

What is claimed is:

1. An assembly including a plurality of memory dies within a package, the assembly comprising:
    a substrate including a plurality of contact pads formed on a surface thereof;
    a first memory die having a first side and a second side, the second side facing the surface of the substrate, the first memory die having at least two memory array portions formed therein, the first side including a plurality of bond pads formed in a center region between the memory array portions, the first memory die further including a redistribution layer that includes re-routing lines that electrically couple the bond pads to re-routed bond pads in a periphery region of the first memory die;
    a first plurality of wires electrically coupling the re-routed bond pads of the first memory die to a first set of the plurality of contact pads of the substrate;
    a second memory die having a first side and a second side, the second side facing the surface of the substrate, the second memory die having at least two memory array portions formed therein, the first side including a plurality of bond pads formed in a center region between the memory array portions, the second memory die further including a redistribution layer that includes re-routing lines that electrically couple the bond pads to re-routed bond pads in a periphery region of the second memory die;
    a second plurality of wires electrically coupling the re-routed bond pads of the second memory die to a second set of the plurality of contact pads of the substrate,
    wherein more than half of the first and second sets of the plurality of contact pads are electrically coupled to both the re-routed bond pads of the first memory die and the re-routed bond pads of the second memory die; and
    wherein the redistribution layer of each of the first and second memory dies includes a ground plane, the ground plane including a line in the periphery region substantially encircling all of the bond pads and a plurality of ground lines between at least some of the re-routing lines.

2. The assembly of claim 1 wherein the first memory die is identical in structure to the second memory die.

3. The assembly of claim 2 wherein the first and second memory dies comprise dynamic random access memory devices.

4. The assembly of claim 3 wherein the first and second memory dies comprise double-data rate dynamic random access memory devices, each memory device including at least 512 Mb of memory cells.

5. The assembly of claim 1 wherein, for both the first and second memory dies, the bond pads are positioned in a left column and a right column running parallel to a center line through the center region of the memory die, each bond pad in the left column being located to the left of the center line and each bond pad in the right column being located to the right of the center line, wherein the redistribution layer routes a plurality of bond pads from the right column across the center line to corresponding re-routed bond pads on the left side of the memory die and also routes a plurality of bond pads from the left column across the center line to corresponding re-routed bond pads on the right side of the memory die.

6. The assembly of claim 1 wherein a plurality of the bond pads comprises data input/output bond pads, wherein the plurality of ground lines surrounds some but not all of the re-routing lines, and wherein the plurality of ground lines runs between re-routing lines that are electrically coupled to the data input/output bond pads.

7. The assembly of claim 1 wherein the ground plane in each redistribution layer includes a plurality of ground planes, wherein each of the plurality of ground planes substantially encircles the associated bond pads on the first memory die and the second memory die, respectively.

8. The assembly of claim 1 wherein, for both the first and second memory dies, the re-routed bond pads comprise elongated bond pads extending from an edge of the memory die toward the center region of the memory die, wherein the first plurality of wires is attached to the re-routed bond pads at a portion of the re-routed bond pads nearer the edge, and wherein the second plurality of wires is attached to the re-routed bond pads at a portion of the re-routed bond pad nearer the center region.

9. The assembly of claim 1 wherein the redistribution layer of each of the first and second memory dies comprises a multi-layer structure.

10. The assembly of claim 9 wherein each of the redistribution layers comprises:
    a titanium layer;
    a copper layer formed on the titanium layer;
    a nickel layer formed on the copper layer; and
    a gold layer formed on the nickel layer.

11. The assembly of claim 1 further comprising a spacer disposed between the first memory die and the second memory die.

12. The assembly of claim 11 wherein the first memory die and the second memory die are both formed on a silicon substrate, and wherein the spacer comprises a silicon spacer.

13. The assembly of claim 1 wherein the substrate includes at least one wiring layer formed inside the substrate, the wiring layer electrically coupling the contact pads to conductive balls on a second surface of the substrate.

14. The assembly of claim 1, for both the first and the second memory dies, the memory die comprising:
   a memory chip including memory array portions formed in a semiconductor substrate and the bond pads electrically coupled to components of the memory array portions;
   a protective layer overlying the memory chip such that the bond pads are exposed, a first portion of the bond pads being positioned on a left side a first line in an interior region of the memory chip and a second portion of the bond pads being positioned on a right side of the first line in the interior region of the memory chip; and
   the redistribution layer formed over the protective layer, the redistribution layer including a plurality of re-routing lines each electrically coupling one of the plurality of bond pads in the interior region to a corresponding re-routed bond pad in a periphery region of the memory chip, wherein the redistribution layer routes the first portion of the plurality of bond pads from the right side across the first line to corresponding re-routed bond pads on the left side of the memory chip and also routes the second portion of the plurality of bond pads from the left side across the first line to corresponding re-routed bond pads on the right side of the memory chip.

15. The assembly of claim 14 wherein the memory chip comprises a dynamic random access memory (DRAM).

16. The assembly of claim 14 wherein the protective layer comprises polyimide.

17. The assembly of claim 14 wherein the bond pads are formed in exactly two columns running down the center region of the protective layer, each column including at least 30 bond pads.

18. The assembly of claim 14 wherein the redistribution layer comprises a multi-layer structure.

19. The assembly of claim 18 wherein the redistribution layer comprises:
   a titanium layer formed on the protective layer;
   a copper layer formed on the titanium layer;
   a nickel layer formed on the copper layer; and
   a gold layer formed on the nickel layer.

20. The assembly of claim 1, for both the first and the second memory dies, the memory die comprising:
   a memory chip including memory array portions formed in a semiconductor substrate and bond pads electrically coupled to components of the memory array portions;
   a protective layer overlying the memory chip and exposing the bond pads, the bond pads being positioned in an interior region of the memory chip; and wherein
   the redistribution layer is formed over the protective layer.

21. The assembly of claim 20 wherein the memory chip comprises a dynamic random access memory (DRAM).

22. The assembly of claim 21 wherein the memory chip comprises a double data rate DRAM, and wherein a portion of the plurality of the bond pads comprises data input/output bond pads.

23. The assembly of claim 22 wherein the plurality of ground lines is between some but not all of the re-routing lines, and wherein the plurality of ground lines is between re-routing lines that are coupled to the data input/output bond pads.

24. The assembly of claim 22 wherein a first portion of the plurality of bond pads are positioned in a left column that runs parallel to a center line in the interior region of the memory chip and a second portion of the plurality of bond pads are positioned in a right column that runs parallel to a center line in the interior region of the memory chip, each bond pad in the left column being located to the left of the center line and each bond pad in the right column being located to the right of the center line, and wherein at least some of the re-routing lines electrically couple certain of the portion of the plurality of bond pads from the right column across the center line to corresponding re-routed bond pads on the left side of the memory chip and some others of the re-routing lines electrically couple certain of the portion of the plurality of bond pads from the left column across the center line to corresponding re-routed bond pads on the right side of the memory chip.

25. The assembly of claim 20 wherein the redistribution layer comprises:
   a titanium layer formed on the protective layer;
   a copper layer formed on the titanium layer;
   a nickel layer formed on the copper layer; and
   a gold layer formed on the nickel layer.

26. An assembly including a plurality of dies within a package, the assembly comprising:
   a substrate;
   a first die located above the substrate, the first die having a first side and a second side, the second side facing the substrate, the first side of the first die having a redistribution layer formed thereon, the redistribution layer including re-routing lines to re-route a plurality of first bond pads from an interior region to first re-routed bond pads in a periphery region, and the first side of the first die having a ground plane substantially encircling the periphery region including all of the bond pads and at least some of the re-routing lines;
   a second die located above the first die, the second die having a first side and a second side, the second side facing the first die, the first side of the second die having a redistribution layer formed thereon, the redistribution layer including re-routing lines to re-route a plurality of second bond pads from an interior region to second re-routed bond pads in a periphery region, and the first side of the second die having a ground plane substantially encircling the periphery region including all of the bond pads and at least some of the re-routing lines; and
   a plurality of wires electrically contacting the first and second re-routed bond pads to a plurality of contact pads arranged on the substrate, wherein more than half of the plurality of contact pads are electrically contacted to both the first and the second re-routed bond pads.

27. The assembly of claim 26 wherein the first die and the second die comprise dynamic random access memory (DRAM) semiconductor devices.

28. The assembly of claim 26 wherein the redistribution layers of both the first die and the second die comprise:
   a titanium layer formed on a protective layer of the die;
   a copper layer formed on the titanium layer;
   a nickel layer formed on the copper layer; and
   a gold layer formed on the nickel layer.

29. The assembly of claim 26 wherein each ground plane comprises a plurality of ground lines between data lines.

30. The assembly of claim 26 wherein the redistribution layer of the first die re-routes the first bond pads from the left side or the right side to the other side and wherein the redistribution layer of the second die re-routes the second bond pads from the left side or the right side to the other side.

31. The assembly of claim 26 further comprising one or more additional dies stacked on the second die.

32. The assembly of claim 26 wherein the size of the second die is such that the second die does not cover the first re-routed bond pads of the first die.

33. The assembly of claim 26 further comprising a spacer positioned between the first die and the second die.

34. An assembly including a plurality of dies within a package, the assembly comprising:
- a substrate;
- a first die located above the substrate, the first die having a top side and a bottom side, the top side having first bond pads formed in an interior region of the first die and having a redistribution layer comprising re-routing lines connecting the first bond pads from the interior region to first re-routed bond pads in a periphery region of the first die and a ground plane substantially encircling the periphery region including all of the first bond pads and at least some of the re-routing lines, and the bottom side of the first die facing the substrate;
- a second die located above the first die, the second die having a first side and a second side, the first side of the second die having second bond pads in an interior region of the second die and having a redistribution layer comprising re-routing lines connecting the second bond pads from the interior region to second re-routed bond pads in a periphery region of the second die and a ground plane substantially encircling the periphery region including all of the second bond pads and at least some of the re-routing lines, and the second side of the second die facing the substrate; and
- a plurality of wires electrically contacting the first and second re-routed bond pads to a plurality of contact pads arranged on the substrate, wherein more than half of the plurality of contact pads are electrically contacted to both the first and the second re-routed bond pads and wherein at least one of the first bond pads and the second bond pads of at least one of the first die and the second die is routed from a left side to a right side, or from the right side to the left side.

35. The assembly of claim 34 wherein the first die and the second die comprise dynamic random access memory (DRAM) semiconductor devices.

36. The assembly of claim 34 wherein the redistribution layers of both the first die and the second die comprise:
- a titanium layer formed on a protective layer of the die;
- a copper layer formed on the titanium layer;
- a nickel layer formed on the copper layer; and
- a gold layer formed on the nickel layer.

37. The assembly of claim 34 further comprising one or more additional dies stacked on the second die.

38. The assembly of claim 34 wherein a size of the second die is such that the second die does not cover the first re-routed bond pads of the first die.

39. The assembly of claim 34 further comprising a spacer positioned between the first die and the second die.

40. An assembly including a plurality of dies within a package, the assembly comprising:
- a substrate including contact pads located adjacent a periphery of a top surface of the substrate, each of the contact pads being electrically coupled to conductors on a bottom surface of the substrate;
- a plurality of identical dies stacked vertically over the substrate, each of the dies having a redistribution layer formed on a top side, the redistribution layer having a plurality of conductive lines re-routing a plurality of bond pads located in columns in an interior region to re-routed bond pads in a periphery region, the redistribution layer having a ground plane comprising a portion substantially encircling the periphery region including all of the bond pads and a plurality of grounded lines separating the conductive lines corresponding to data lines; and
- a plurality of bond wires, each bond wire electrically coupling one of the re-routed bond pads to a corresponding contact pad on the substrate.

41. The assembly of claim 40 wherein the dies comprise dynamic random access memory (DRAM) semiconductor dies.

42. The assembly of claim 40 wherein the redistribution layer re-routes a plurality of bond pads from a left side to a right side and a plurality of bond pads from the right side to the left side.

43. The assembly of claim 40 wherein the re-routed bond pads comprise elongated pads, and wherein a location of the bond wires on the re-routed pads is related to a distance of the die from the substrate.

44. The assembly according to claim 40 further comprising for each adjacent pair of dies, a spacer disposed between the two dies.

* * * * *